United States Patent
Lee et al.

(10) Patent No.: US 7,579,040 B2
(45) Date of Patent: Aug. 25, 2009

(54) METHOD FOR FABRICATING ORGANIC ELECTRO-LUMINANCE DEVICE

(75) Inventors: Ho Nyun Lee, Seoul (KR); Chang Nam Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 858 days.

(21) Appl. No.: 11/008,788

(22) Filed: Dec. 10, 2004

(65) Prior Publication Data
US 2005/0129840 A1   Jun. 16, 2005

(30) Foreign Application Priority Data
Dec. 11, 2003   (KR)   ................ 10-2003-0090167

(51) Int. Cl.
*B05D 5/12* (2006.01)
(52) U.S. Cl. ............... 427/66; 313/504; 313/505; 313/509; 428/917; 445/24; 427/259; 427/271; 427/553
(58) Field of Classification Search ......... 313/504–505, 313/509; 427/66, 69, 250, 251, 259, 271, 427/553; 428/690, 917; 445/24
See application file for complete search history.

(56) References Cited

U.S. PATENT DOCUMENTS 5,701,055 A * 12/1997 Nagayama et al. .......... 313/504
6,538,390 B2 * 3/2003 Fujita et al. ............... 315/169.3
2001/0035393 A1 * 11/2001 Lu et al. ..................... 216/23
2002/0011783 A1 * 1/2002 Hosokawa .................. 313/504
2003/0006697 A1   1/2003 Weaver ...................... 313/503
2003/0025118 A1   2/2003 Yamazaki et al. ............ 257/79

FOREIGN PATENT DOCUMENTS

| CN | 1363200 A | 8/2002 |
| EP | 0 732 868 B1 | 5/2000 |
| JP | 2001-015267 | 1/2001 |

OTHER PUBLICATIONS

Japanese Office Action dated Nov. 22, 2006.
European Search Report dated Jun. 28, 2006.

* cited by examiner

*Primary Examiner*—Timothy H Meeks
*Assistant Examiner*—Jimmy Lin
(74) *Attorney, Agent, or Firm*—Holland & Knight LLP

(57) ABSTRACT

Provided is a method for fabricating an organic EL device that can prevent delamination of an electrode. The method includes: forming electrode separators on a substrate, the electrode separators being spaced apart by a constant distance from one another; and depositing an electrode material on an entire surface of the substrate including the electrode separators to form an electrode separated by the electrode separators. According to the present invention, since the anode is automatically separated in the unit of pixels due to the existence of the electrode separator, delamination of the anode can be prevented, and further product reliability can be enhanced. Also, since a complicated photolithography process is not needed, process efficiency can be enhanced.

5 Claims, 14 Drawing Sheets

METHOD FOR FABRICATING ORGANIC ELECTRO-LUMINANCE DEVICE

This application claims the benefit of the Korean Application No. 10-2003-0090167 filed on Dec. 11, 2004, which is hereby incorporated by reference.

BACKGROUND OF THE INVENTION

1. Field of the Invention

The present invention relates to a flat panel display, and more particularly, to a method for fabricating an organic EL device that can prevent delamination of an electrode.

2. Discussion of the Related Art

In recent years, as the size of the display devices increases, demand on a flat panel display occupying a small space increases. As one of the flat panel displays, an organic electro-luminance (EL) device called an organic light emitting diode (OLED) is being developed in a rapid speed, and various prototypes have been published.

The organic EL device is a device to emit light while an electron and a hole are injected into an organic emission layer disposed between a first electrode, electron injection electrode (cathode) and a second electrode, hole injection electrode (anode), the electron and the hole are bonded to form a pair of electron and hole and generate an exciton, and the generated exciton disappears from an excited state to a base state.

Such an organic EL device is being actively researched due to a relatively low operation voltage of 5-10 V compared with a plasma display panel (PDP) or an inorganic EL display.

Also, the organic EL device has superior feature such as a wide viewing angle, a high speed response and a high contrast.

Accordingly, the organic EL device can be used as a pixel of a graphic display, a television image display or a pixel of a surface light source.

Further, since the organic EL device can be formed on a flexible transparent substrate and has slim, lightweight and good color sense characteristics, it is suitable for a next generation flat panel display (FDP).

Furthermore, since the organic EL device does not need a backlight compared with the LCD well known, it has advantages such as a low power consumption and a superior color sense.

In general, the organic EL devices can be classified into a passive matrix type and an active matrix type.

Unlike in the passive matrix type organic EL device, in the active matrix type organic EL device, when light is emitted through the glass surface, which is generally called 'bottom emission', as the size or the number of thin film transistors (TFT) increases, the aperture ratio is reduced by geometric progression, which makes it impossible to use the active matrix type organic EL device as a display device.

To overcome such a drawback, a top emission structure in which light is emitted through an opposite surface to the glass surface has appeared. In the top emission organic EL device, the aperture ratio has no relation with the TFTs.

The top emission organic EL device includes a substrate having TFTs and storage capacitors formed thereon, a reflective layer formed on the substrate, and an organic emission layer and a transparent electrode layer sequentially formed on the reflective layer. Light emitted from the organic emission layer is reflected by the reflective layer and then emitted toward an opposite direction to the substrate. Accordingly, the aperture ratio is not lowered due to the TFTs.

Next, a method for fabricating a top emission active type organic EL device according to the related art will be described with reference to FIGS. 1A through 1F.

First, a thin film transistor (TFT) 12 is formed in the unit of pixel on a transparent substrate 11.

Specifically, amorphous silicon is formed on the transparent substrate 11.

The amorphous silicon is melted and recrystallized into a poly silicon film by a laser annealing.

The poly silicon film is patterned by a photolithography process and an etch process, thereby forming an island-shaped semiconductor film 12a.

A gate insulating layer is formed on an entire surface of a resultant substrate including the semiconductor film 12a.

Next, a metal film, for example, Chromium (Cr) film is formed on the gate insulating layer.

The metal film is patterned by a photolithography process and an etch process, thereby forming a gate electrode 12c at an area corresponding to and overlapping a center portion of the semiconductor film 12a on the gate insulating layer 12b.

Next, p-type or n-type impurities are implanted into the semiconductor film 12a using the gate electrode 12c as a mask.

Thereafter, the impurities-implanted semiconductor film 12a is annealed to activate the implanted impurities, so that a source region 12d and a drain region 12e are formed in the semiconductor film 12a, thereby completing the TFT 12.

Next, a first insulating layer 13 is formed on an entire surface of a resultant substrate including the TFT 12.

Thereafter, a contact 14 penetrating the first insulating layer 13 and the gate insulating layer 12b to contact the source electrode 12d and the drain electrode 12e, respectively is formed on the first insulating layer 13, and then a second insulating layer 15 is formed on an entire surface of a resultant substrate including the contact 14.

Next, as shown in FIG. 1B, a planarization insulating layer 16 is formed on the second insulating layer 15.

Thereafter, the planarization insulating layer 16 and the second insulating layer 15 are selectively removed by a photolithography process and an etch process to form a via-hole 17 exposing a surface of the contact 14 contacting the drain electrode 12e.

Next, as shown in FIG. 1C, an anode material 18 is deposited on the planarization insulating layer 16 including the via-hole 17 such that the via-hole 17 is filled with the anode material 17.

Next, as shown in FIG. 1D, the deposited anode material 18 is selectively removed by a photolithography process and an etch process to selectively separate the anode in the unit of pixel, thereby forming the anode 18a. Thereafter, an insulating layer is formed on the anode 18a except for an emission region.

Next, as shown in FIG. 1E, an organic EL layer 22 is formed on an entire surface of the insulating layer 21.

Next, as shown in FIG. 1F, a cathode 23 is formed on the organic EL layer 22, thereby completing the top emission active matrix organic EL device according to the related art.

However, in the top emission active matrix organic EL device according to the related art, the anode 18a may be delaminated from the planarization insulating layer 16 while the photoresist is removed.

The delamination problem will now be described in more detail with reference to FIGS. 2A through 2D.

After the anode material 18 has been deposited as shown in FIG. 1C, the photolithography process and the etch process are performed to separate the anode in the unit of pixel.

That is, as shown in FIG. 2A, the photoresist 19 is coated on the anode 18 and then a mask 20 is aligned above the transparent substrate 11 such that an edge portion of the pixel is exposed.

Next, light is irradiated onto the transparent substrate 11 through the mask 20, thereby exposing the photoresist 19 to light.

Thereafter, the mask is removed and then the exposed photoresist is developed, so that exposed portions of the photoresist are removed as shown in FIG. 2B.

Next, as shown in FIG. 2C, the anode material is selectively removed by using the photoresist 19 as a mask, thereby forming the anode 18a. Thereafter, the resultant substrate is loaded into a stripper, so that the photoresist is stripped by a chemical processing in the stripper.

However, while the photoresist 18 is stripped, the anode 18a is delaminated as shown in FIG. 2D due to a processing environment in the stripper and a weak adhesive force between the anode 18a and the planarization insulating layer 16.

SUMMARY OF THE INVENTION

Accordingly, the present invention is directed to a method for fabricating an organic EL device that substantially obviates one or more problems due to limitations and disadvantages of the related art.

An object of the present invention is to provide a method for fabricating an organic EL device that can prevent delamination of an electrode.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method for fabricating an organic EL device, the method including: forming electrode separators on a substrate, the electrode separators being spaced apart by a constant distance from one another; and depositing an electrode material on an entire surface of the substrate including the electrode separators to form an electrode separated by the electrode separators.

In another aspect of the present invention, there is provided a method for fabricating an organic EL device, the method including: forming a TFT in the unit of pixel on a substrate; forming an insulating layer on an entire surface of the substrate including the TFT; forming an electrode separator on the insulating layer corresponding to the TFT; and depositing an anode material on an entire surface of the insulating layer including the electrode separator to form an anode separated by the electrode separator.

In still another aspect of the present invention, there is provided a method for fabricating an organic EL device, the method including: forming a TFT in the unit of pixel on a substrate; forming an insulating layer on an entire surface of the substrate including the TFT; forming a via-hole penetrating the insulating layer to contact the TFT at a predetermined portion of the insulating layer; forming an electrode separator on a predetermined portion of the insulating layer where an anode is being separated; and depositing an anode material on an entire surface of the insulating layer including the via-hole and the electrode separator to form an anode separated by the electrode separator.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

FIGS. 3A through 3E are sectional views illustrating a process of fabricating an organic EL device according to the present invention, and FIGS. 4A through 4E are sectional views taken along the direction A-A in the processes of FIGS. 3A through 3E.

Figure 1A:
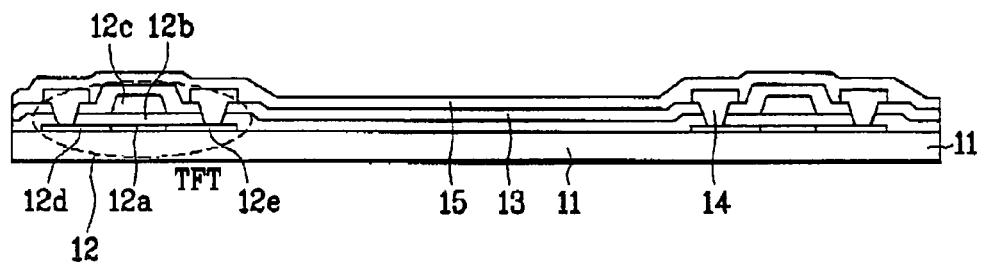
FIGS. 1A through 1F are sectional views illustrating a process of fabricating an organic EL device according to the related art.
Figure 1B:
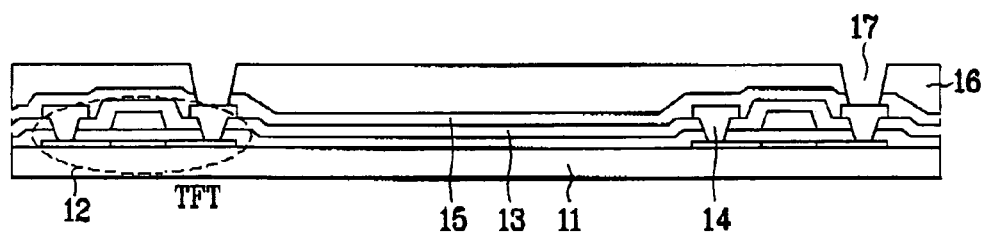
Figure 1C:
Figure 1D:
Figure 1E:
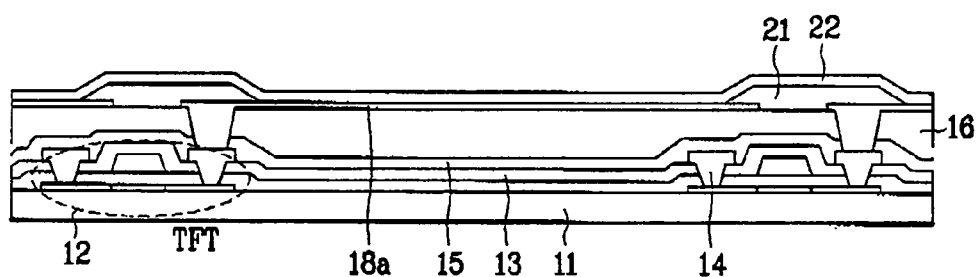
Figure 1F:
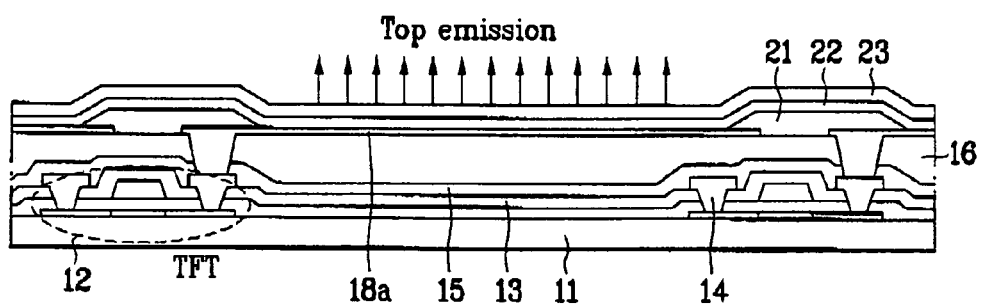
Figure 2A:
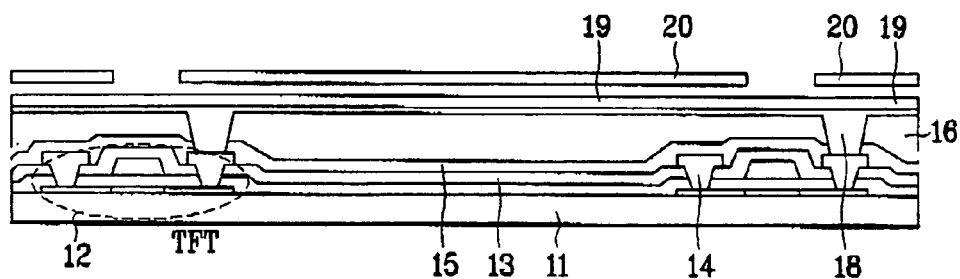
FIGS. 2A through 2D are sectional views illustrating a problem that may be caused in a process of fabricating an organic EL device according to the related art.
Figure 2B:
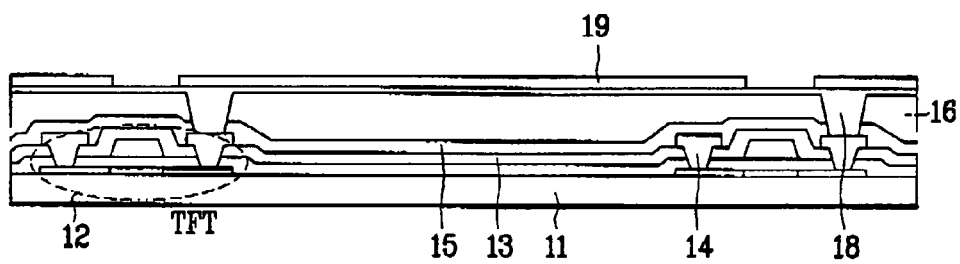
Figure 2C:
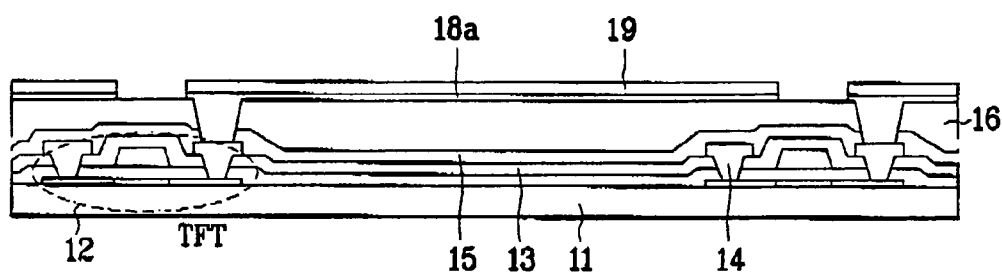
Figure 2D:
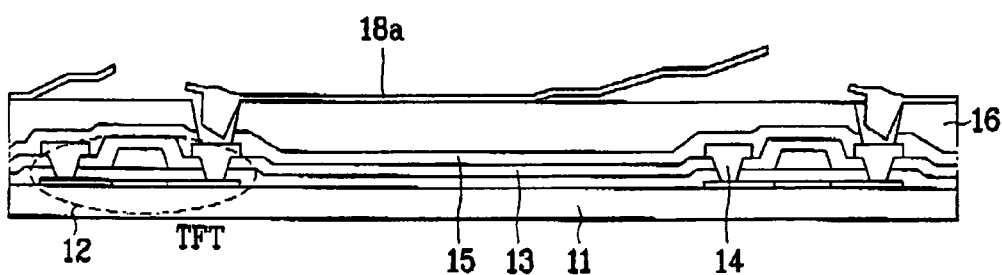
Figure 3A:
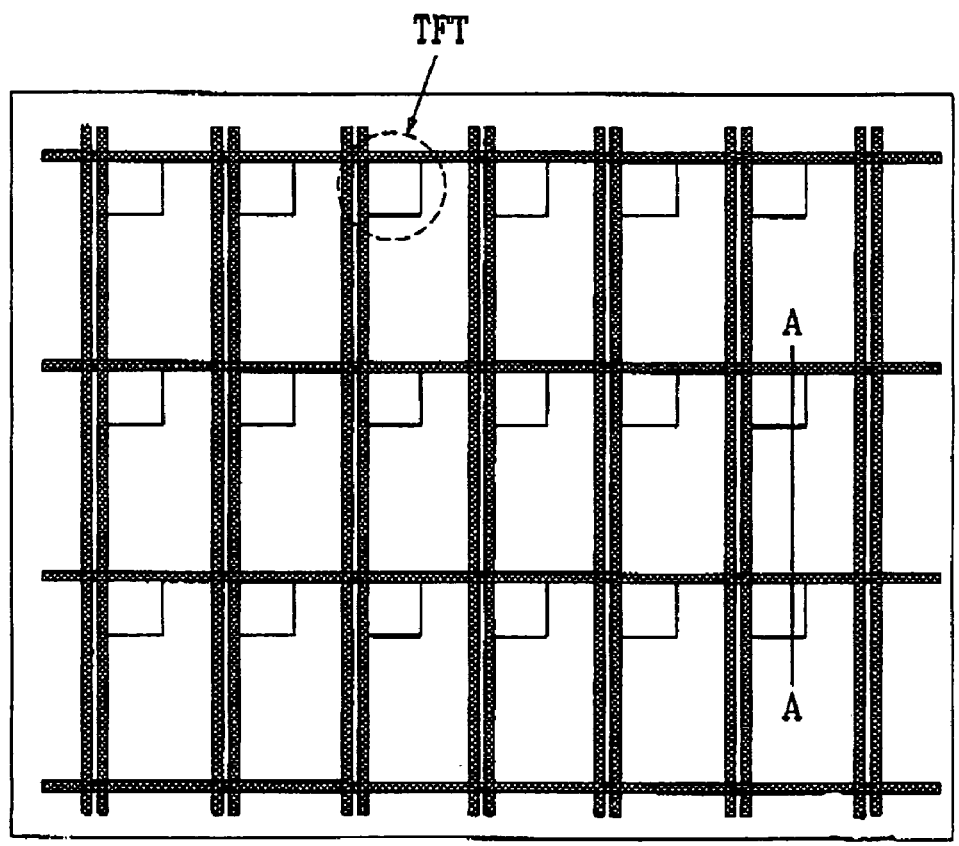
FIG. 3A through 3E are sectional views illustrating a process of fabricating an organic EL device according to the present invention.
Figure 4A:
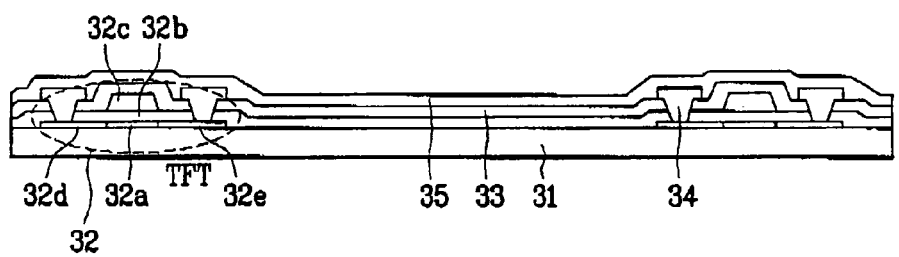
FIGS. 4A through 4E are sectional views taken along the direction A-A in the processes of FIGS. 3A through 3E.

In the method of fabricating an organic EL device according to the present invention, as shown in FIGS. 3A and 4A, thin film transistors (TFTs) 32 are formed in the unit of pixel on a transparent substrate 31.

Specifically, amorphous silicon is formed on the transparent substrate 31.

The amorphous silicon is melted and recrystallized into a poly silicon film by a laser annealing.

Thereafter, the poly silicon film is patterned by a photolithography process and an etch process, thereby forming an island-shaped semiconductor film 32a.

Next, a gate insulating layer 32b is formed on an entire surface of a resultant substrate including the semiconductor film 32a, and then a metal film, for example, Chromium (Cr) film is formed on the gate insulating layer 32b.

The metal film is patterned by a photolithography process and an etch process, thereby forming a gate electrode 32c at an area corresponding to and overlapping a center portion of the semiconductor film 32a on the gate insulating layer 32b.

Next, p-type or n-type impurities are implanted into the semiconductor film 32a using the gate electrode 32c as a mask.

Thereafter, the impurities-implanted semiconductor film 12a is annealed to active the implanted impurities, so that a source region 32d and a drain region 32e are formed in the semiconductor film 32a, thereby completing the TFT 32.

Next, a first insulating layer 33 is formed on an entire surface of a resultant substrate including the TFT 32.

Thereafter, a contact 34 penetrating the first insulating layer 33 and the gate insulating layer 32b to contact the source electrode 32d and the drain electrode 32e, respectively is formed on the first insulating layer 33, and then a second insulating layer 35 is formed on an entire surface of a resultant substrate including the contact 34.

Figure 3B:
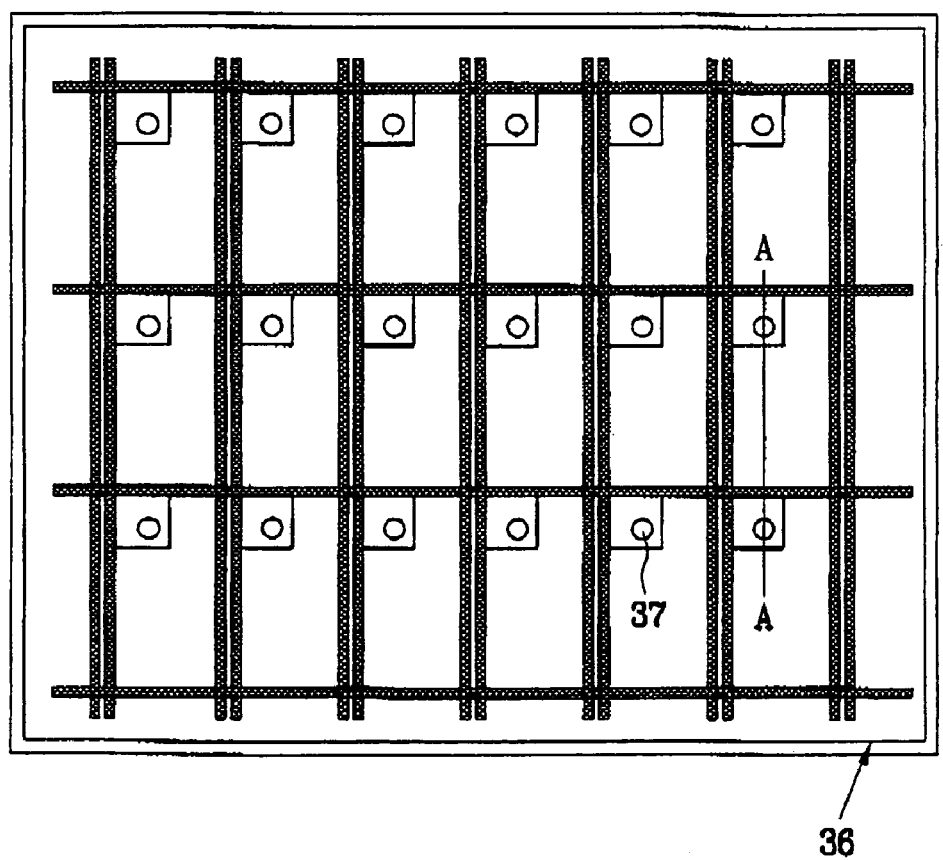
Figure 4B:
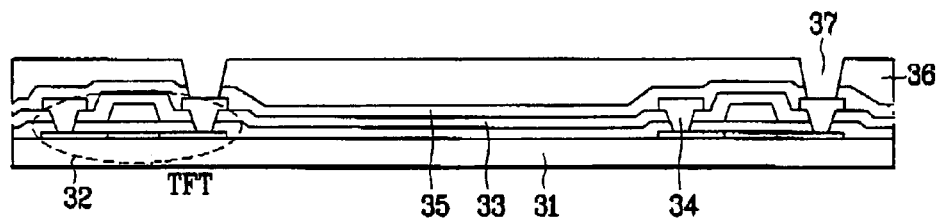

Next, as shown in FIGS. 3B and 4B, a planarization insulating layer 36 is formed on the second insulating layer 35.

Thereafter, the planarization insulating layer 36 and the second insulating layer 35 are selectively removed by a photolithography process and an etch process to form a via-hole 37 exposing a surface of the contact 34 contacting the drain electrode 32e.

Figure 3C:
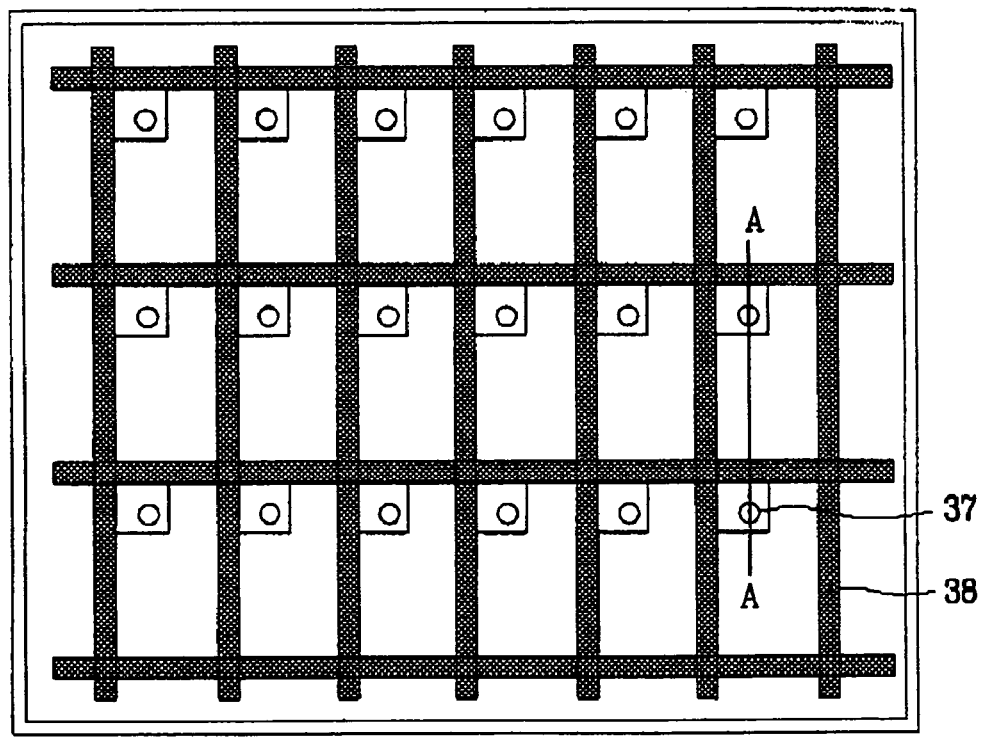
Figure 4C:
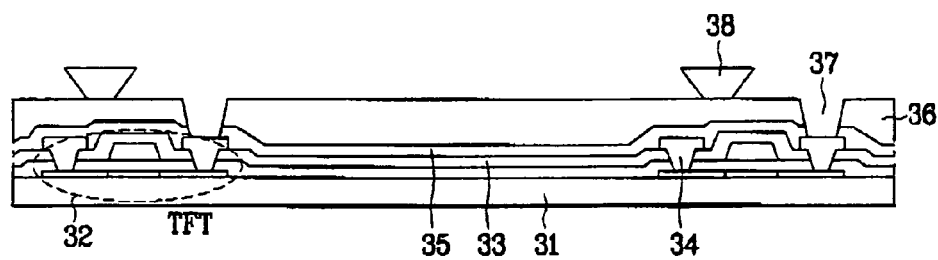

Next, as shown in FIGS. 3C and 4C, an electrode separator 38 is formed at a portion for separation of the anode (e.g., a boundary between pixels).

In the above processes, the process for forming the planarization insulating layer 36 may be omitted. If the planarization insulating layer 36 is not formed, the electrode separator 38 is formed on the second insulating layer 35.

The electrode separator 38 can be formed by various methods, for example, a negative PR process or an etch process.

In addition, the electrode separator 38 is preferably made in a shape that an upper width thereof is larger than a lower width. Alternatively, the electrode separator 38 may have an over-hang structure.

Figure 5A:
FIGS. 5A through 5E are sectional views illustrating an electrode separator according to the present invention.
Figure 5B:
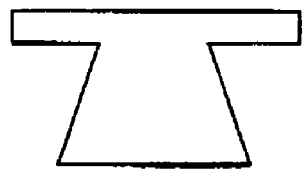
Figure 5C:
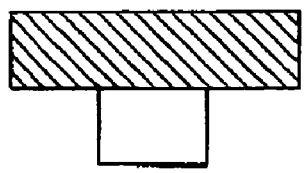
Figure 5D:
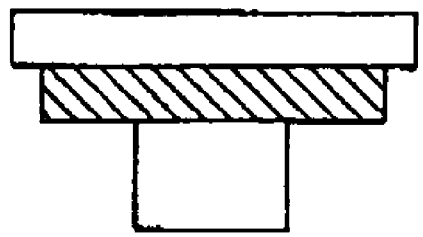
Figure 5E:
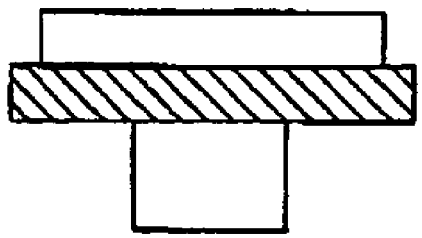

In another modification, the electrode separator 38 can be made in a reverse trapezoid as shown in FIG. 5A, shapes shown in FIGS. 5B and 5C, or at least two layered shapes shown in FIGS. 5D and 5E.

Alternatively, the electrode separator 38 is made of at least one selected from the group consisting of organic material, inorganic material, metal and a mixture of them.

Figure 3D:
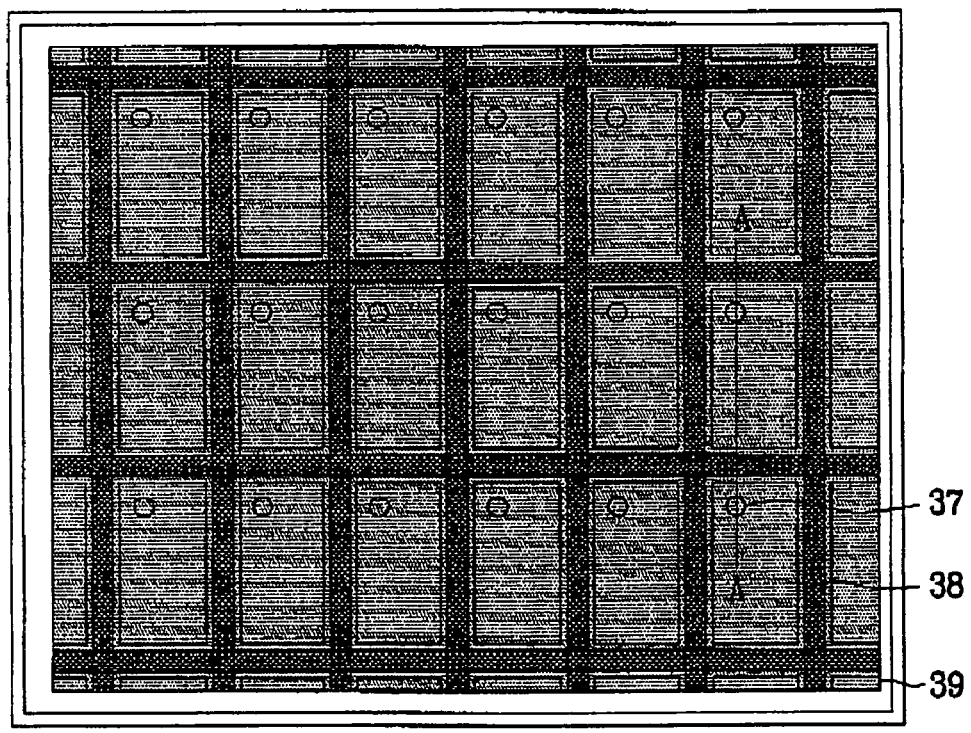
Figure 4D:
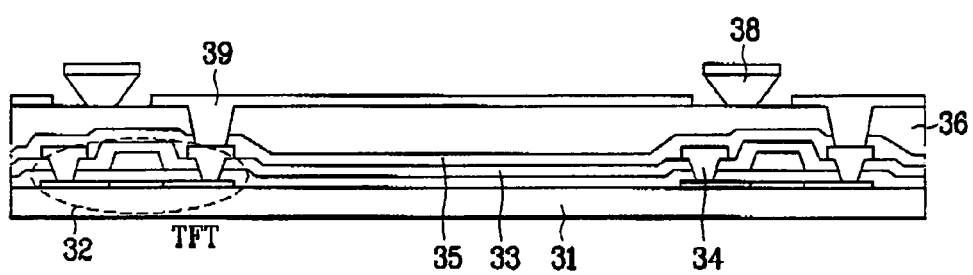

Next, as shown in FIGS. 3D and 4D, an anode material is deposited on the planarization insulating layer 36 including the electrode separator 38 such that the via-hole 37 is filled with the anode material.

The anode material includes a conductive material having a high reflectivity, for example, metal such as Cr, Cu, W, Au, Ni, Al, AlNd, Ag, Ti, Ta and the like, alloy of the metals, or a multi-layer film using the same.

Next, as shown in FIG. 4D, the electrode separator 38 is formed at the portion to separate the anode and is shaped in a reverse trapezoid, that is, lower width is smaller than upper width. Accordingly, while the anode material is deposited, the anode material is separated centering on the electrode separator 38. As a consequence, the anode 39 is formed on the planarization insulating layer 36.

Of course, the anode material is formed even on the electrode separator 38 as well as on the planarization insulating layer 36. However, due to the existence of the electrode separator 38, the anode material on the electrode separator 38 and the anode material on the planarization insulating layer 36 are automatically separated from each other.

Figure 3E:
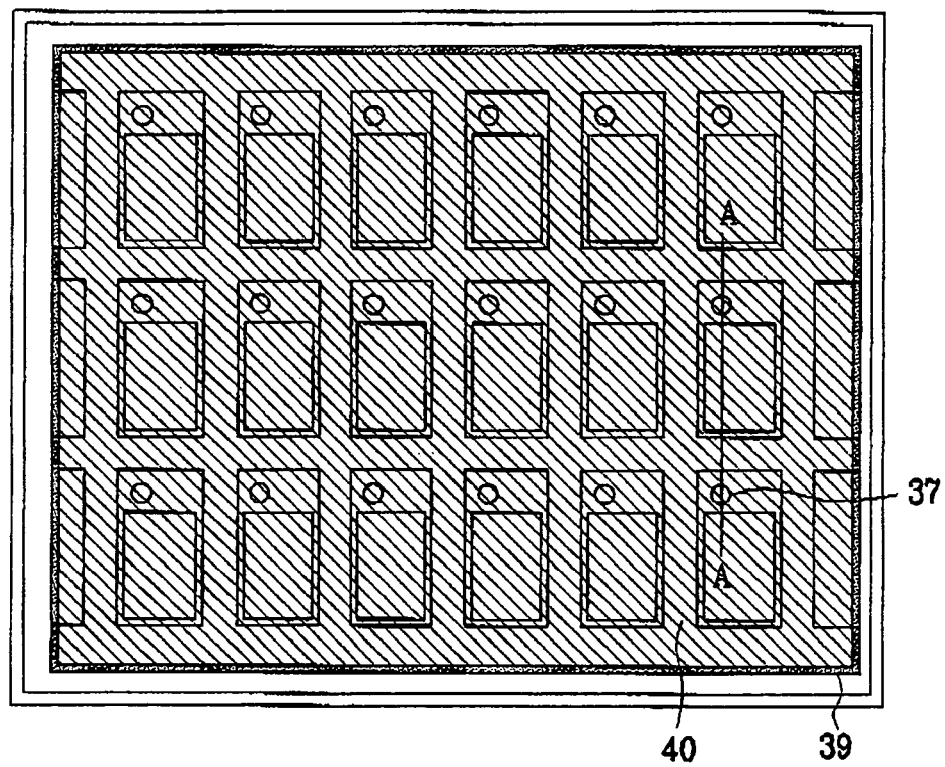
Figure 4E:
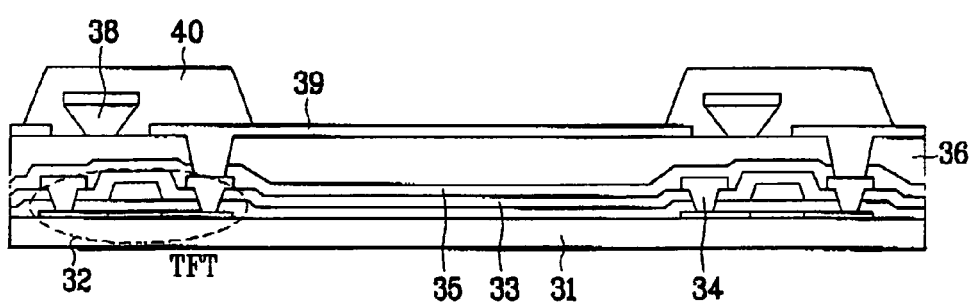

Next, as shown in FIGS. 3E and 4E, an insulating layer 40 is formed on a remaining portion except for a real display area of the entire display area.

At this time, the insulating layer may be inorganic insulator or organic insulator.

In case of using the inorganic insulator as the insulating layer 40, SiNx and SiOx are preferable. In case of using the organic insulator as the insulating layer 40, polyimide, polyacryl, and novolac-based material are preferable.

Also, although not shown in the drawings, an organic EL layer is formed on an entire surface of a resultant substrate including the insulating layer 40, and then a cathode is formed on the organic EL layer, thereby completing the organic EL device according to the present invention.

The method for fabricating an organic FT, device according to the present invention has the following effects.

First, since the anode is automatically separated in the unit of pixels due to the existence of the electrode separator, a separate photolithography process is not needed. Accordingly, delamination of the anode can be prevented, and further product reliability can be enhanced.

Second, since complicated photolithography process (including photoresist coating, mask aligning, exposure and developing, and anode separating, and photoresist stripping) for separation of the anode is not needed, the fabrication process is simplified, resulting in enhancement in process efficiency.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating an organic EL device, the method comprising:
    forming a TFT in the unit of pixel on a substrate;
    forming a first insulating layer on an entire surface of the substrate including the TFT;
    forming a via-hole penetrating the first insulating layer;
    forming an electrode separator on a predetermined portion of the first insulating layer so as to separate anodes from each other in the unit of pixel, wherein the electrode separator is formed in a shape that an upper width is larger than a lower width at a boundary between the pixels;
    depositing an anode material on an entire surface of the first insulating layer including the via-hole and the electrode separator, such that the anodes are automatically separated from each other by the electrode separator, wherein each of the anodes is formed in the unit of pixel and is connected with the thin film transistor through the via-hole in the unit of pixel;
    forming a second insulating layer at a portion except for an emission area of the each pixel on the anode and electrode separator, wherein the second insulating layer covers the electrode separator and the anode material on the electrode separator; and
    sequentially depositing an organic EL layer and a cathode on the anode including the second insulating layer, wherein the anode is below the organic EL layer and the cathode is on the organic EL layer.

2. The method of claim 1, wherein the electrode separator is shaped in a reverse trapezoid.

3. The method of claim 1, wherein the electrode separator comprises at least two layers.

4. The method of claim 1, wherein the electrode separator is made of at least one selected from the group consisting of organic material, inorganic material, and a mixture of them.

5. The method of claim 1, wherein the forming the electrode separator comprises at least one of a negative photoresist process and an etch process.

* * * * *